United States Patent [19]
Prokopp

[11] Patent Number: 6,154,863
[45] Date of Patent: Nov. 28, 2000

[54] APPARATUS AND METHOD FOR TESTING NON-COMPONENTED PRINTED CIRCUIT BOARDS

[75] Inventor: Manfred Prokopp, Wertheim-Reicholzheim, Germany

[73] Assignee: atg Test Systems GmbH, Germany

[21] Appl. No.: 08/956,810

[22] Filed: Oct. 23, 1997

[30] Foreign Application Priority Data

Oct. 28, 1996 [DE] Germany .......................... 196 44 725
May 2, 1997 [DE] Germany .......................... 197 18 637

[51] Int. Cl.[7] .................................................. G01R 31/28
[52] U.S. Cl. ........................................ 714/724; 324/158.1
[58] Field of Search .................................. 714/724, 725, 714/733, 734; 324/761, 750, 754, 755, 758, 763, 512, 158.1

[56] References Cited

U.S. PATENT DOCUMENTS

| | | | |
|---|---|---|---|
| 5,457,380 | 10/1995 | Blumenau | 324/158.1 |
| 5,633,598 | 5/1997 | Loan et al. | 324/761 |
| 5,764,069 | 6/1998 | Cugini | 314/761 |
| 5,798,654 | 8/1998 | Loan et al. | 324/761 |

FOREIGN PATENT DOCUMENTS

| | | | |
|---|---|---|---|
| 0 215 146 | 8/1988 | European Pat. Off. | G01R 1/073 |
| 0 448 483 A1 | 9/1991 | European Pat. Off. | G01R 1/073 |
| 0 636 895 A1 | 2/1995 | European Pat. Off. | G01R 31/28 |
| 2 608 775 | 6/1988 | France | G01R 31/02 |
| 38 38413 A1 | 5/1990 | Germany | G01R 31/28 |
| 42 37 591 A1 | 5/1994 | Germany | G01R 31/28 |
| 43 23 276 A1 | 1/1995 | Germany | G01R 31/28 |
| 44 06 538 A1 | 8/1995 | Germany | G01R 31/28 |
| 195 07 127 A1 | 9/1996 | Germany | G01R 31/28 |
| WO 95/23341 | 8/1995 | WIPO | G01R 31/00 |
| WO 96/27136 | 9/1996 | WIPO . | |

*Primary Examiner*—Trinh L. Tu
*Attorney, Agent, or Firm*—Hamilton, Brook, Smith and Reynolds, P.C.

[57] ABSTRACT

A circuit board test apparatus comprising a plurality of circuit board test points is provided with an electronic analyzer comprising a plurality of test connections, each circuit board test point of the board under test being in contact with a test connection via an electrical connection. At least two of the electrical connections are electrically connected so that at least two circuit board test points of the board under test are in connection with a sole test connection.

47 Claims, 8 Drawing Sheets

FIG. 6 ns. 6,154,863

APPARATUS AND METHOD FOR TESTING NON-COMPONENTED PRINTED CIRCUIT BOARDS

RELATED APPLICATIONS

This application claims priority to German Application No. 197 18 637.8 filed May 2, 1997 by Manfred Prokopp and German Application No. 196 44 725.9 filed Oct. 28, 1996 by Manfred Prokopp.

This application is related to U.S. Ser. No. 08/956,583 filed Oct. 23, 1997, entitled "Printed Circuit Board Test Apparatus and Method", by Manfred Prokopp, the entire teachings of which are incorporated herein by reference.

BACKGROUND OF THE INVENTION

Printed circuit boards comprise a plurality of circuits, the density of which on the circuit boards is increasing all the time as miniaturization of electronics components continues.

Known circuit board test fixtures or apparatus can be basically divided into two classes. Belonging to the first class are fixtures having an adapter in which all circuit board test points are contacted simultaneously by means of the adapter. The second class comprises the so-called finger testers, these being fixtures which sequentially scan the individual circuit board test points by two or more finger probes.

Adapter-type test fixtures are disclosed, for example, in DE 42 37 591 A1, DE 44 06 538 A1, DE 43 23 276 A, EP 215 146 B1, and DE 38 38 413 A1.

Such adapters basically serve to adapt the irregular configuration of the circuit board test points of the board under test to a given grid pattern of the electrical test fixture. In the case of modern circuit boards to be tested, these test points are no longer arranged in a regular grid pattern, this being the reason why the contact nails producing the connection between the contact grid pattern and the circuit board test points are arranged tilted or deflecting in the adapter or a so-called translator is provided which "translates" the regular contact grid pattern into the irregular configuration of the circuit board test points.

Depending on the type of apparatus involved, the individual circuits are tested for open circuits in the circuits ("open-circuit test") and for shorts to other circuits ("short-circuit test"). The short-circuit test may involve detecting both low-impedance and high-impedance shorts.

Various test methods are known for both open-circuit and short-circuit testing, in which each circuit is tested for a short circuit or each branch of a circuit tested for an open circuit. Modern circuit boards having a large number of circuits require a corresponding large number of individual test procedures to be carried out.

Attempts have been made to optimize the individual test procedures and to minimize the number thereof, a plurality of differing methods having been proposed and put into practice for this purpose.

SUMMARY OF THE INVENTION

The invention is based on the object of providing a circuit board test apparatus of simple configuration with which circuit boards having a high circuit board test point density and/or very small spacings between the circuit board test points can be tested.

This object is achieved by an apparatus for testing printed circuit boards comprising a plurality of circuit board test points. The apparatus includes an electronic analyzer comprising a plurality of test connections. Each circuit board test point is in contact with a test connection of the electronic analyzer via an electrical connection, wherein at least two of the electrical connections are electrically connected to each other so that at least two circuit board test points of the board under test are in connection with a single test connection.

In accordance with the invention, each of the test connections of the electronic analyzer is connected to several circuit board test points and/or to several contact points of a grid pattern of the test apparatus. As a result, the number of units of the electronic analyzer as compared to the electronic analyzer of a comparable test apparatus is considerably reduced, and the overall configuration of the test apparatus is significantly simplified.

The invention is furthermore based on the object of defining a method of testing circuit boards by means of a test apparatus comprising an adapter which is simpler and faster than comparable known methods.

The methods in accordance with the invention permit a significant reduction in the number of individual test procedures. These methods are applicable to particular advantage in conjunction with an apparatus in accordance with the invention.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the drawings, like reference characters refer to the same parts throughout the different views. The drawings are not necessarily to scale, emphasis instead being placed upon illustrating the principles of the invention.

The invention will now be described in more detail with reference to the drawing in which:

FIG. 6 is a schematic simplified illustration of a further pattern as viewed from above;

DESCRIPTION OF THE PREFERRED EMBODIMENTS

The test apparatus comprises an electronic analyzer which is electrically connected to a grid pattern. Mounted on the grid pattern is an adapter. A board under test is placed on the adapter, the latter producing an electrical connection between the points on the board under test and a contact point or a pad field of the grid pattern in each case. A translator board may be inserted in the adapter by means of which the electrical connections can be translated from one contact point to a circuit board test point spaced away from the former.

Figure 1:
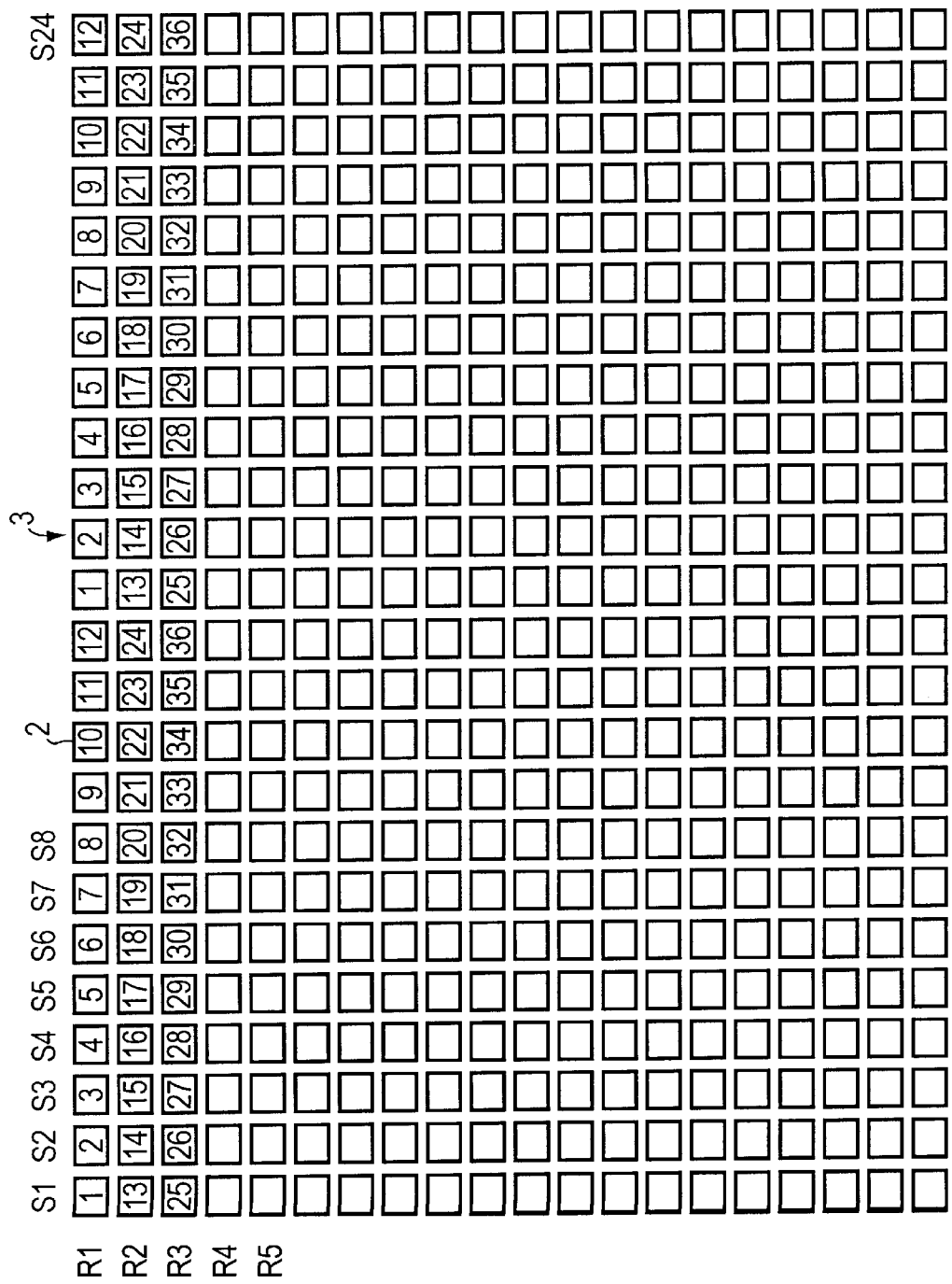
FIG. 1 is a simplified schematic illustration of a base grid pattern as viewed from above.

Referring to FIG. 1, the apparatus in accordance with the invention comprises a grid pattern array 1 having several contact points 2 configured on a grid base 3, at least two contact points 2 of the grid pattern array 1 being electrically connected in the grid base 3.

The grid base 3 is preferably configured as a laminated circuit board. The example embodiment as shown in FIG. 2 comprises an upper and lower defining layer 4, 5 and thirteen intermediate layers 6.

Extending from each contact point 2 vertically upwards through the topmost layer 4 and all intermediate layers 6 is a vertical feed-through contact 7. The feed-through contacts 7 are configured preferably as holes having a conductive, metallized plating. The feed-through contacts 7 are arranged, for example, in a regular square grid pattern, the center-spacing a between two feed-through contacts 7 being 500 $\mu$m, for example. In the case of ceramic grid bases 3, the center-spacing a may be reduced down to 100 $\mu$m. Other kinds of regular grid patterns are possible, such as, e.g., a rectangular or hexagonal grid pattern or also a grid pattern in which the feed-through contacts 7 of adjacent rows are arranged staggered. The feed-through contacts 7 and the corresponding contact points 2 are thus arranged in rows (R1, R2, . . . ) and columns (S1, S2, . . . ) (FIG. 1). Between two rows of feed-through contacts 7, conductor paths 10 are embedded in the grid base 3. These paths are termed scanning channels in the following discussion. In the example embodiment as shown in FIG. 1, twelve scanning channels 10 are provided between two rows of feed-through contacts 7 each, this being twenty-four in the case of the example embodiment as shown in FIG. 2, each arranged in pairs in an intercoating between two intermediate layers 6. The twelve pairs of scanning channels 10 arranged adjacent to a row of feed-through contacts 7 in each case are assigned to this row, i.e., each plated-through contact 7 and thus each contact point 2 of a certain row is connected electrically with one of the scanning channels 10 assigned to this row via a branch line 11.

Figure 2:
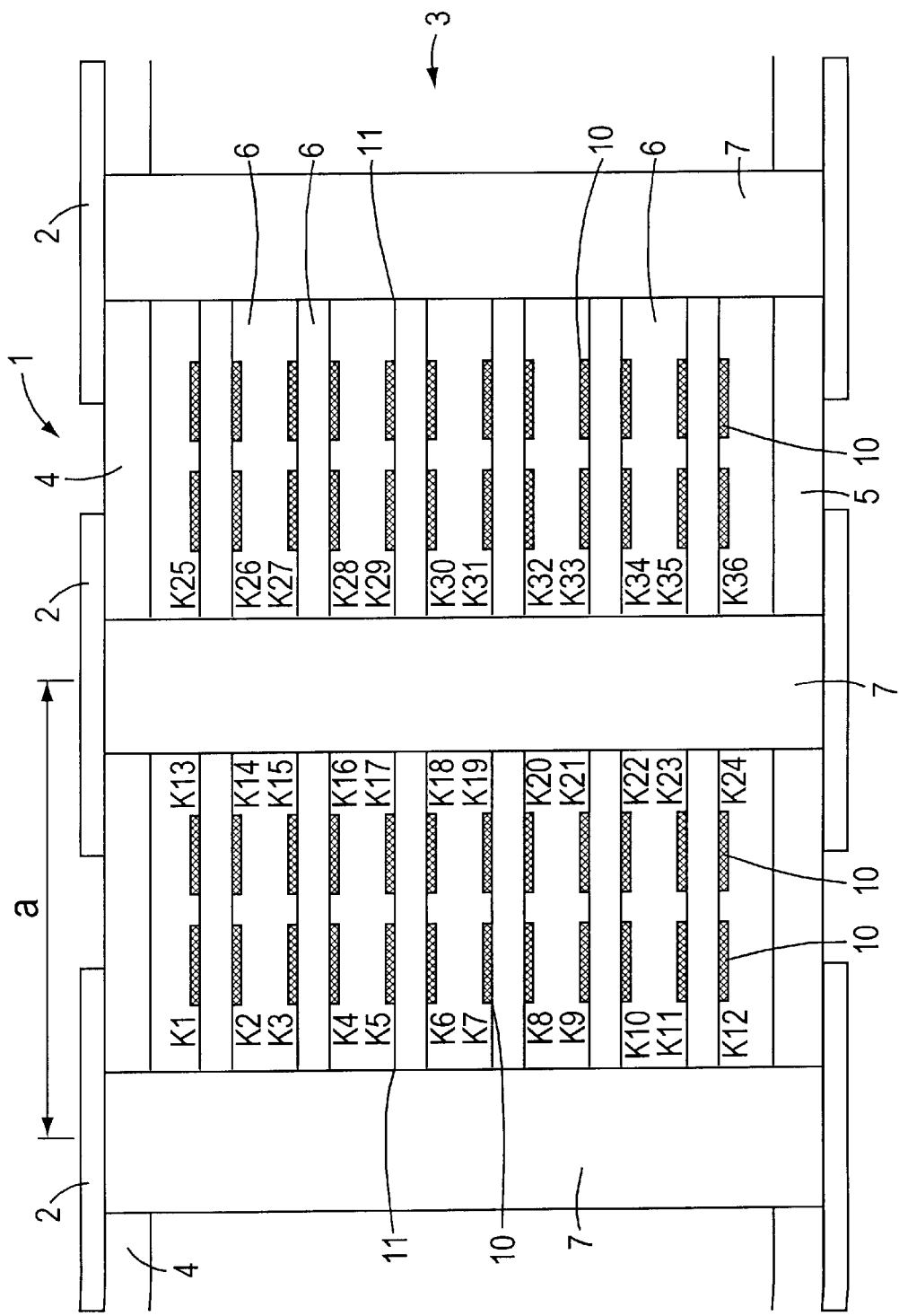
FIG. 2 is a cross-section through a grid base in the portion between two scanning channels.

In FIG. 2 the 36 channels are identified as K1 to K36, and correspond in FIG. 1 to the contact points 2 of the first three rows. The channels connect to the similarly numbered contact points. In accordance with the embodiment as shown in FIG. 1, each 12th contact point 2 in a row is electrically connected to the same scanning channel 10. This means in other words that every 12th contact point 2 of a row is electrically connected via a scanning channel 10, thus providing scanning of a number of contact points 2 by a single scanning channel 10 in each case. As a result, the conductor path structure in the grid base 3 is substantially simplified so that the feed-through contacts 7 can be more tightly spaced than on conventional grid bases and thus the grid pattern density of the contact points 2 can be significantly increased.

The scanning channels 10 are connected at the edges of the grid base 3 to electrical connections such as, e.g., connectors to which the scan or electronic analyzer circuitry is connected. Despite the many contact points 2 on the grid pattern array 1, the number of test connections of the electronic analyzer is relatively low; one test connection is provided for each scanning channel 10.

In known test apparatus, a separate test connection to the electronic analyzer is provided for each contact point 2. As compared to these known test apparatus, the electronic circuitry of the analyzer is considerably reduced, namely by precisely the degree with which the contact points are grouped together by the scanning channels.

Instead of a connector, any suitable releasable and non-releasable electrical connection may be provided at the interface between the grid base 3 and the electronic analyzer. For example, the test connections may be soldered to the scanning channels 10. Such a non-releasable electrical connection is especially suitable when the electronic analyzer is integrated in the grid base 3 or secured adjacent to the underside of the grid base 3.

In addition to this, the mechanical configuration of the apparatus in accordance with the invention is very simple since the electrical connections are arranged on the side of the grid base 3 so that the electronics can be arranged physically separate from the grid base 3. Accordingly, pressure elements, such as, e.g., a pressure plate may be arranged directly underneath the grid base 3 with which the grid base 3 and an adapter and/or a translator are pressed against the board under test.

Due to the electrical connection of the contact points, individual circuits of the board under test are electrically connected so that a conventional open circuit or short-circuit test would not possible for so-called parallel testers (=test apparatus and adapter).

One possibility of avoiding unwanted electrical connections between individual circuits is the application of adjacency programs known in finger testers. These programs determine between which circuits of the board under test practically no electrical connections can occur in the circuit board so that an electrical connection of two such circuits satisfying the adjacency criterion does not negatively affect testing via the contact points of the grid pattern.

Figure 3:
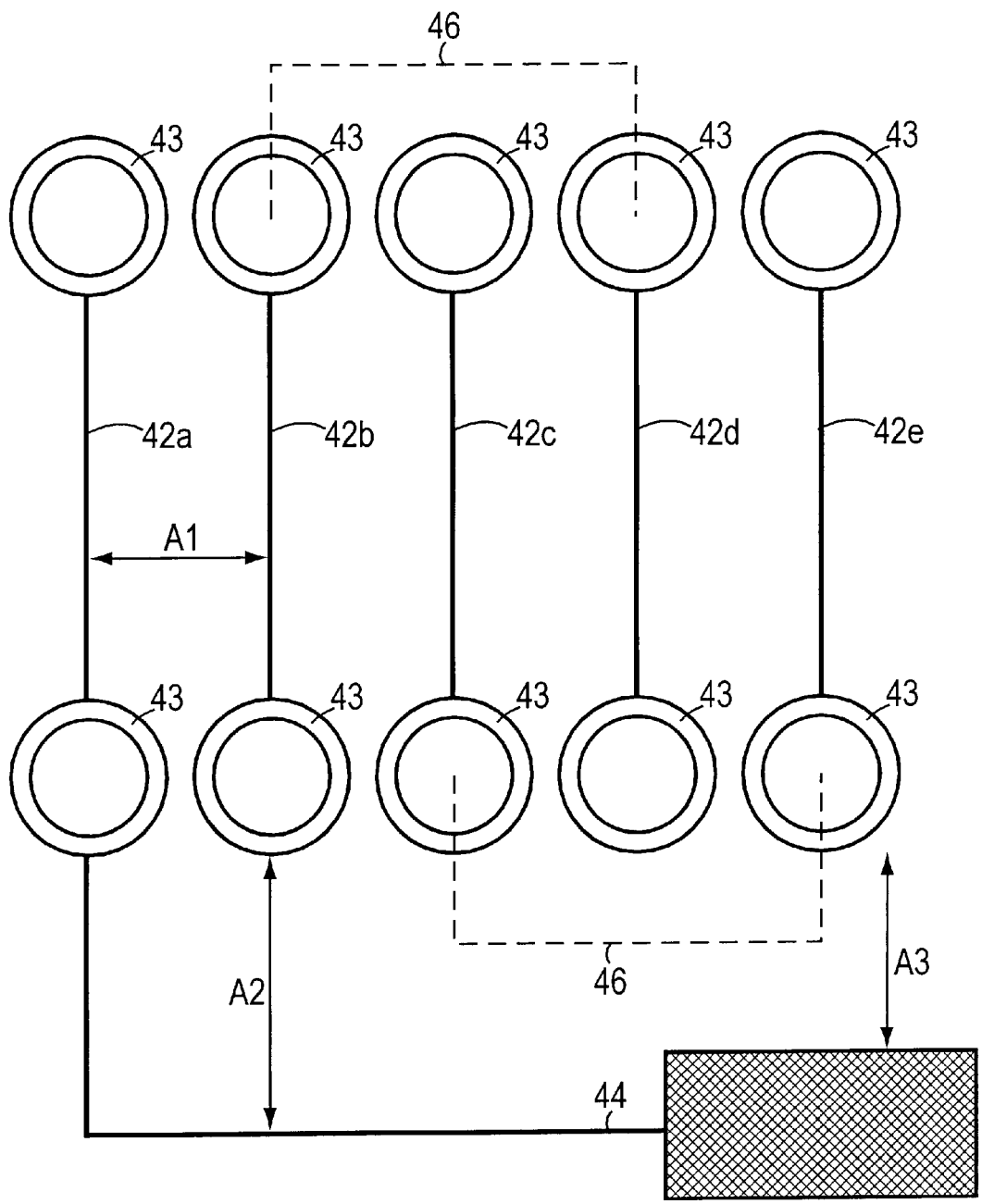
FIG. 3 is a view from above of the conductor path pattern to illustrate the adjacency criteria.

Illustrated, schematically simplified, in FIG. 3 are five conductor path sections 42a to 42e. Each of these conductor path sections 42a to 42e is arranged in parallel to the other, each comprising at its end points a contact ring 43. In FIG. 3, only the conductor path section 42a arranged on the left is connected to a further conductor path section 44 oriented downswept and parallel to a row of contact rings 43 of the remaining conductor path 42b to 42e sections. The conductor path section 44 comprises at one end a contact pad 45.

Whether an electrical connection may occur between two specific conductor paths can be judged by the following adjacency criteria:

1. If a further conductor path exists between two specific conductor paths, a short circuit cannot occur directly between the two specific conductor paths. Running between the conductor path sections 42b and 42d is the conductor path section 42c, and between the conductor path sections 42c and 42e is the conductor path section 42d. A short circuit cannot occur directly between the conductor path sections 42b and 42d or 42c and 42e respectively without a short circuit occurring between the directly adjacent conductor path sections. Accordingly, it is sufficient to test the directly adjacent conductor paths for a short circuit. The conductor paths not directly adjacent thus satisfy an adjacency criterion and can be linked to each other electrically for a short-circuit test, as is indicated schematically by the broken lines 46 in FIG. 3.

2. If the spacing between two conductor paths is at no location less than a predetermined adjacency spacing, a short circuit can be principally excluded between the two conductor paths. The train of conductor paths making up the conductor path sections 42a and 44 features differing spacings A1 to A3 from the individual conductor paths without a further conductor path being arranged in-between. These spacings A1 to A3 are to be compared to the adjacency spacing, the corresponding conductor paths satisfying the adjacency criterion when the spacings A1 to A3 from the individual conductor paths 42b to 42e are greater than the adjacency spacing. The adjacency spacing depends substantially on the method with which the circuit board is fabricated and as a rule is in the range 0.5 mm to 5 mm and preferably in the range 1 mm to 3 mm.

3. If the conductor paths are arranged in other layers in the circuit board, they cannot form a short circuit and they satisfy a further adjacency criterion.

In judging whether a short circuit can occur between two conductor paths, one or more of the above adjacency criteria are employed which are logically linked to an "or" so that satisfying a single criterion is sufficient to exclude a short circuit between the conductor paths. If special methods are employed in fabricating the circuit boards, e.g. when a stopper is coated between certain portions of the circuit board so that no short-circuit can occur between these conductor paths from these portions, the aforementioned adjacency criteria is preferably supplemented by these specific criteria.

The conductor path or circuit pairs satisfying the adjacency criteria can be electrically connected via the scanning channels 10.

These "desired" short-circuits or electrical connections are not only of no detriment to testing, they even result in testing being accelerated and simplified since in each case two or more circuits can be tested in a single test simultaneously.

Figure 4:
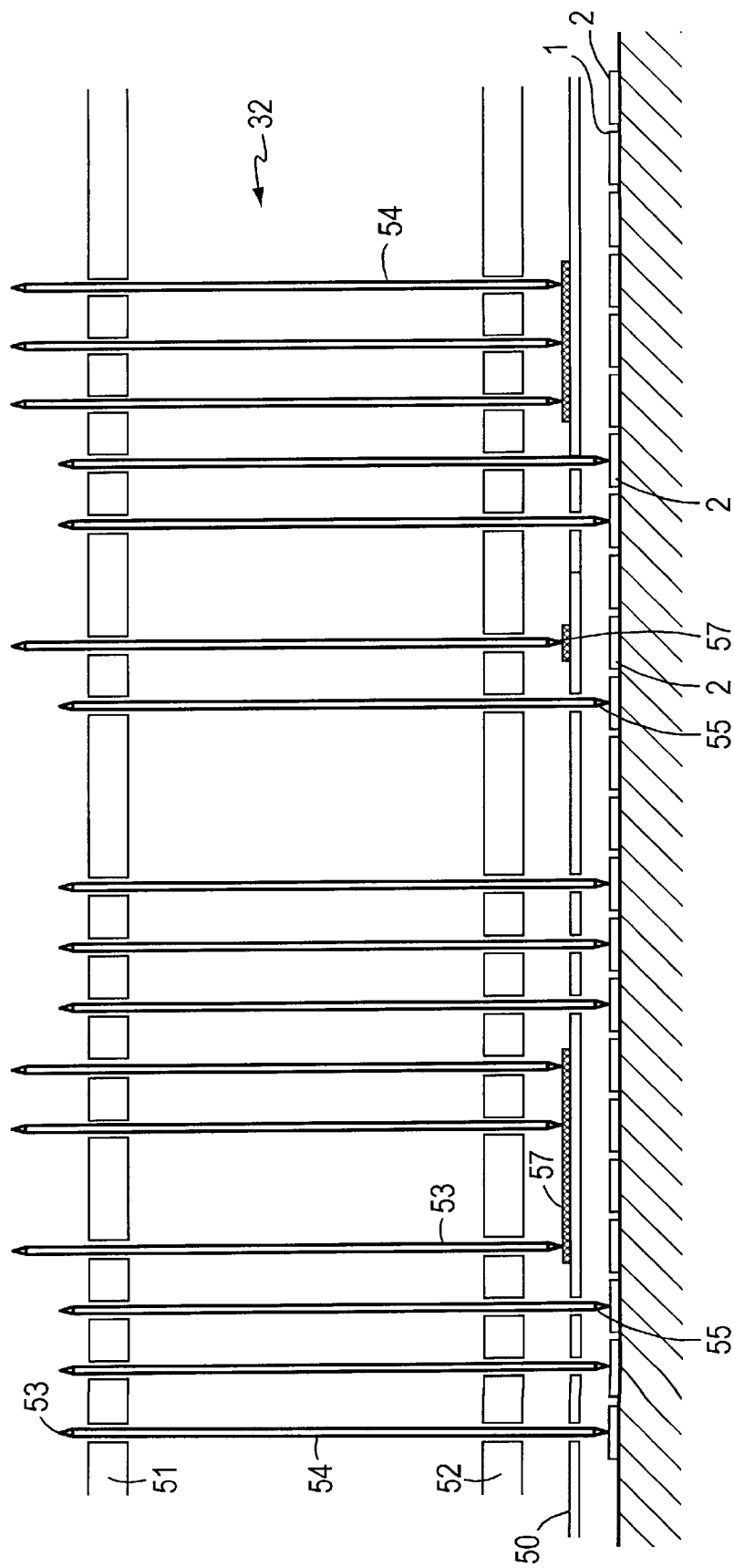
FIG. 4 is a cross-section through an adapter including a linking mask.

Such desired electrical connections can also be artificially generated (FIG. 4) by means of a linking mask 50 inserted between the grid base and the adapter. Schematically illustrated in FIG. 4 is an adapter 32, known as such, having a top and bottom defining layer 51, 52 in each of which holes are drilled in a predetermined pattern through which nail- or needle-like test probes 54 extend. The probes 54 electrically connect the contact points 2 of a grid pattern array 1 to the test points of a board under test.

The invention is not restricted to the adapter 32 as described above. It is applicable just as well to a kink-type test probe adapter or an adapter comprising instead of nail-like test probes 54 bending nail test probes or electrically conducting rubber buttons.

The linking mask 50 is arranged on the grid pattern array 1 and comprises a plurality of holes 55 through which the probes 54 of the adapter 32 pass to come into contact with the contact points 2 of the grid pattern 1. Provided on the surface of the linking mask 50, facing the adapter 32, are conductor paths 57, each of which electrically connects at least two probes 54 of the adapter 32 not in contact with the contact points 2 of the grid pattern 1. Via these conductor paths 57 and the corresponding probes 54 of the adapter 32, electrical connections are produced specifically between the individual circuits of the board under test, as a result of which the linked circuits can be short-circuit tested in a single step like a single circuit, thus speeding up testing. In FIG. 4 the conductor paths 57 on the surface of the linking mask 50 are shown. These conductor paths 57 may be configured also within the linking mask 50 in the scope of the invention by extending the paths on the surface only to small conductor path contact points and then providing electrical connections, where necessary, directly to a contact point 2 on the underside. In combination with the linking function or also without a linking function, such a mask may provide a very dense grid pattern of conductor path contact points. The points are arranged distributed on the surface of the mask 50 and connected by means of a conductor path 57 to a sole contact point 2 of the grid pattern directly or via a probe 54, a circuit and a further probe 54. The conductor path contact points are configured preferably significantly smaller than the contact points 2 and, for instance, as squares having a side length of 100 $\mu$m to 800 $\mu$m. With the aid of such an adapter mask it is thus possible to increase the density of the contact points 2 of the grid pattern simply by mounting a mask having a tighter and denser array of conductor path contact points.

Ideally, by means of the electrical connections of the linking mask 50 between the individual circuits of the board under test, the circuits can be linked or electrically connected to a total of only two arrays of circuits so that testing for a short circuit on the circuit board can be achieved simply by a single test between the two arrays.

This linking board 50 may be employed to test for open circuits whereby individual circuits of a board under test are electrically connected at their ends, in series, via the linking board 50. A long conductor train thus materializes, which can be tested for open circuits in a single test.

This linking board may be put to use to great advantage together with the test apparatus as described above in which several contact points are connected to each other via a scanning channel 10. In this arrangement, the linking board 50 results in several interlinked circuits of the circuit board being connected simply to a sole contact point 2.

In FIG. 4 the linking mask 50 is relatively thick and arranged spaced away from the grid pattern array 1 so that the probes 54 resting on the conductor paths 57 at the upper layer 51 of the adapter 32 protrude significantly more than the remaining probes 54 inserted in the holes 55. This is due to illustration in the drawing. Such linking masks 50 are 50 $\mu$m thick so that the level differences of the probes caused by the linking mask 50 are within usual tolerances. However, a thicker and stronger linking mask could also be used, this then requiring compensation in the length of the probes 54b resting on the conductor paths 57, which should be somewhat shorter.

Figure 5:
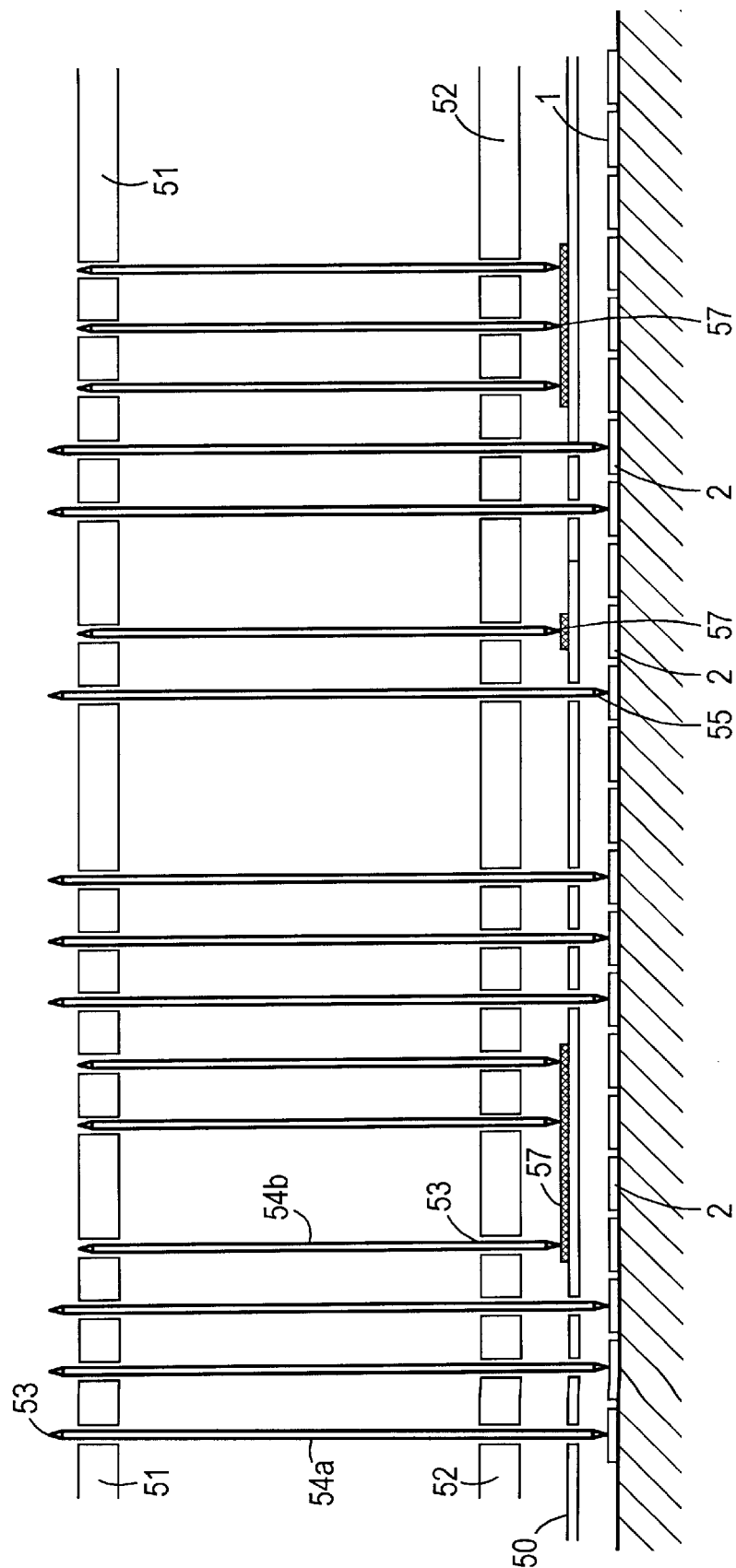
FIG. 5 is a cross-section through a two-stage adapter.

Illustrated in FIG. 5 is a similar adapter 32 and linking board 50. The basic configuration of this adapter is identical to that as shown in FIG. 4, the only difference being in the length of the probes. The probes 54a, inserted in the holes 55 of the linking board 50, are longer than those resting on the conductor paths 57 of the linking board 50.

With this adapter 32, the circuits of a board under test can be tested for shorts in a first test, with only the longer probes 54a being in contact with the circuit board test points. In a second test, the shorter probes 54b are brought into contact with the circuit board test points by pressing the board under test against the adapter with greater force.

In the first test during which only the longer probes 54a are in contact with the circuit board test points, a short-circuit test is implemented. In this arrangement, each circuit is contacted by a single probe 54b.

In the second test, during which both the shorter and the longer probes 54b, 54a are in contact with the circuit board test points, the open-circuit test is implemented. Due to the contacting with the shorter probes 54b, individual sub-circuits are connected in series.

Ideally, without application of the adjacency criteria, only one scanning channel 10 is needed for each circuit of the board under test since during short-circuit testing each circuit needs to be contacted once. During the open-circuit test, the individual circuits or portions thereof merely need to be linked to each other. On application of the adjacency criteria, a further reduction in the number of scanning channels needed is basically possible.

Open circuits and/or short-circuits may be detected by means of capacitance testing as is known in finger testers. In this arrangement several circuits can be simultaneously scanned by a single test.

Capacitance testing may also be done taking into account the adjacency criterion, as a result of which accuracy in testing is enhanced.

The aforementioned possibility of avoiding undesirable electrical connections may be put to use singly or in combination.

Figure 6:
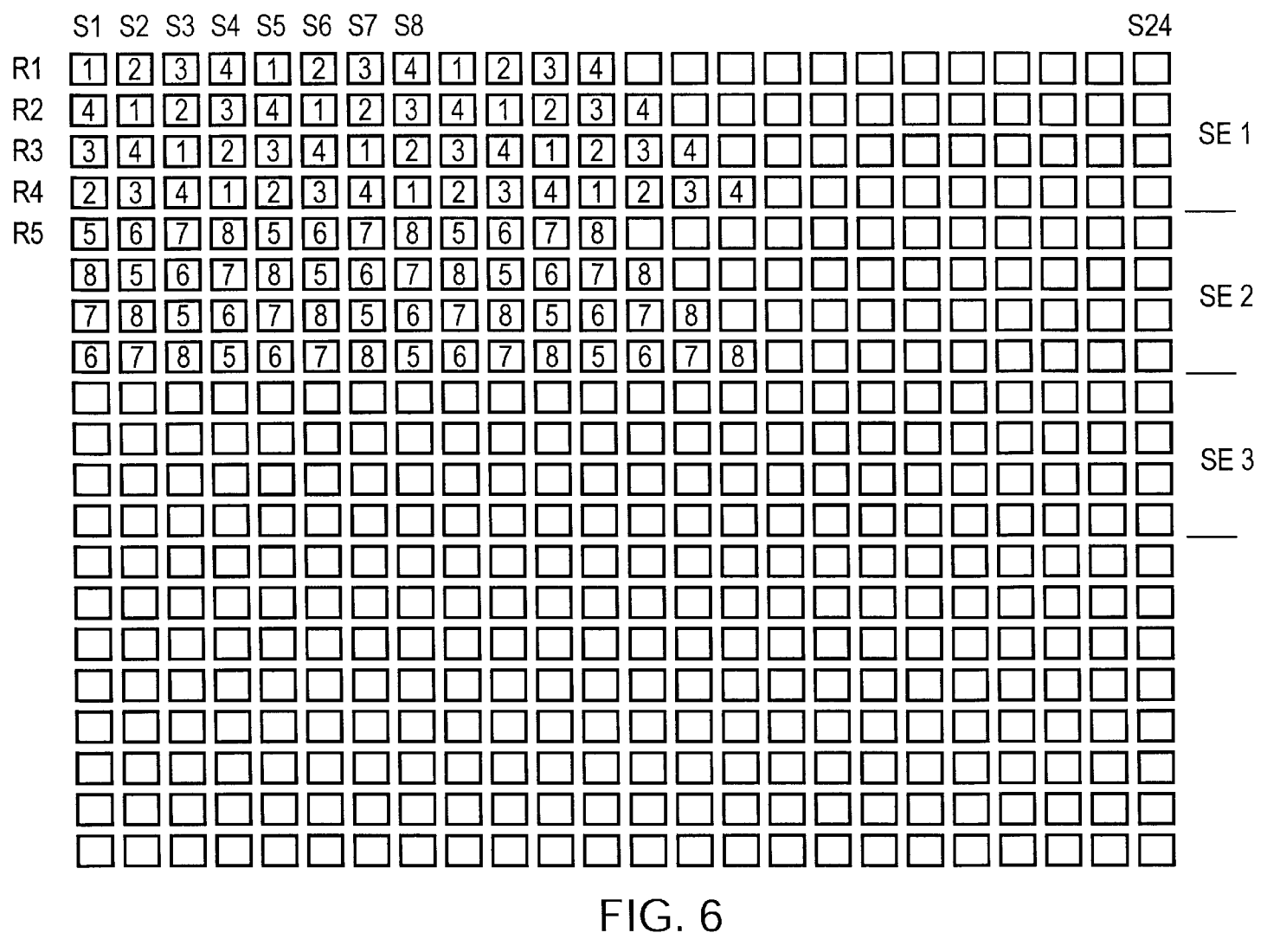

A further example embodiment of a grid pattern array in accordance with the invention is illustrated in FIG. 6. This grid pattern array is divided into 20 horizontal rows (R1–R20) and 24 vertical columns (S1–S24). The number of rows and columns will be far greater in an actual application. Four adjacent rows (R1–R4; R5–R8; R9–R12; etc.) each form a segment (SE1, SE2, SE3, etc.). In the segments, each fourth contact point of a row is connected to a scanning channel. In the segments, contact points 2 of the individual rows are connected to the same scanning channel, the contact points of two adjacent rows connected to a scanning channel being preferably arranged diagonally on the grid base. In the example embodiment as shown in FIG. 5, four scanning channels are provided per segment. In the first segment, the contact points 1 are connected to the first of the scanning channels, the contact points 2 to the second scanning channel, the contact points 3 to the third scanning channel and the contact points 4 to the fourth scanning channel. The scanning channels comprise electrical connections to the contact points 2 of several rows, the contact points 2 of adjacent rows or columns connected to a scanning channel being arranged preferably staggered. Since the scanning channels are connected to contact points of several rows the number of scanning channels is further reduced.

The scanning channels 10 between the individual layers 6 in the grid base 3 can be arranged in differing directions as viewing the grid base 3 from above, they being, more particularly, arranged vertically to each other, as a result of which a local selectivity can be achieved.

Figure 7:
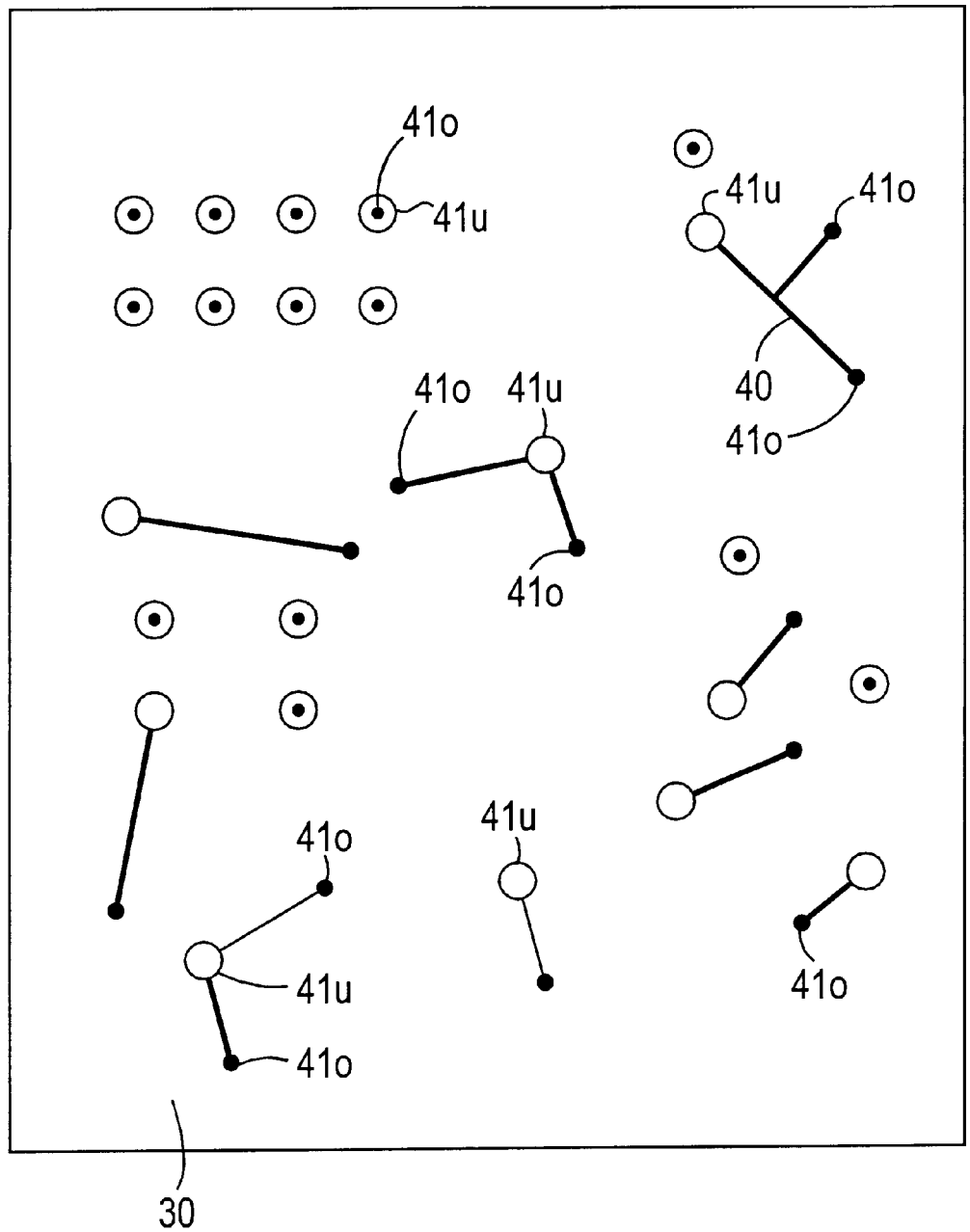
FIG. 7 is a schematic view from above of the conductor paths of a translator.

The principle of achieving a high circuit board test point density in accordance with the invention by electrically connecting or short-circuiting individual electrical connections between the circuit board test points of the board under test and the test connections of the electronic analyzer may also be implemented by electrical connection in a translator board 30 (FIG. 7). For this purpose, the translator board 30 is arranged between two adapters, a full grid cassette or full grid adapter arranged between the grid pattern and the translator board 30, and the pin translator adapter 32 which is arranged between the translator board 30 and the board under test. In the translator board 30, several pins of the pin translator adapter are connected to each other electrically by means of a conductor path 40, each of the conductor paths 40 being in contact with only a single probe of the full grid adapter or a sole contact point 2 of the grid pattern array. These conductor paths 10 thus link two or more upper contact pads 41o to a sole lower contact pad 41u. This "electrical connection via the translator board" enables the number of pins of the pin translator adapter to be larger than the number of probes of the full grid adapter or larger than the number of contact points 2 of the grid pattern array. This embodiment can be achieved in existing test apparatus highly cost-effectively and results in an increase in the effective circuit board test point density. The aforementioned methods of avoiding undesirable electrical connections can be applied likewise.

Figure 8:
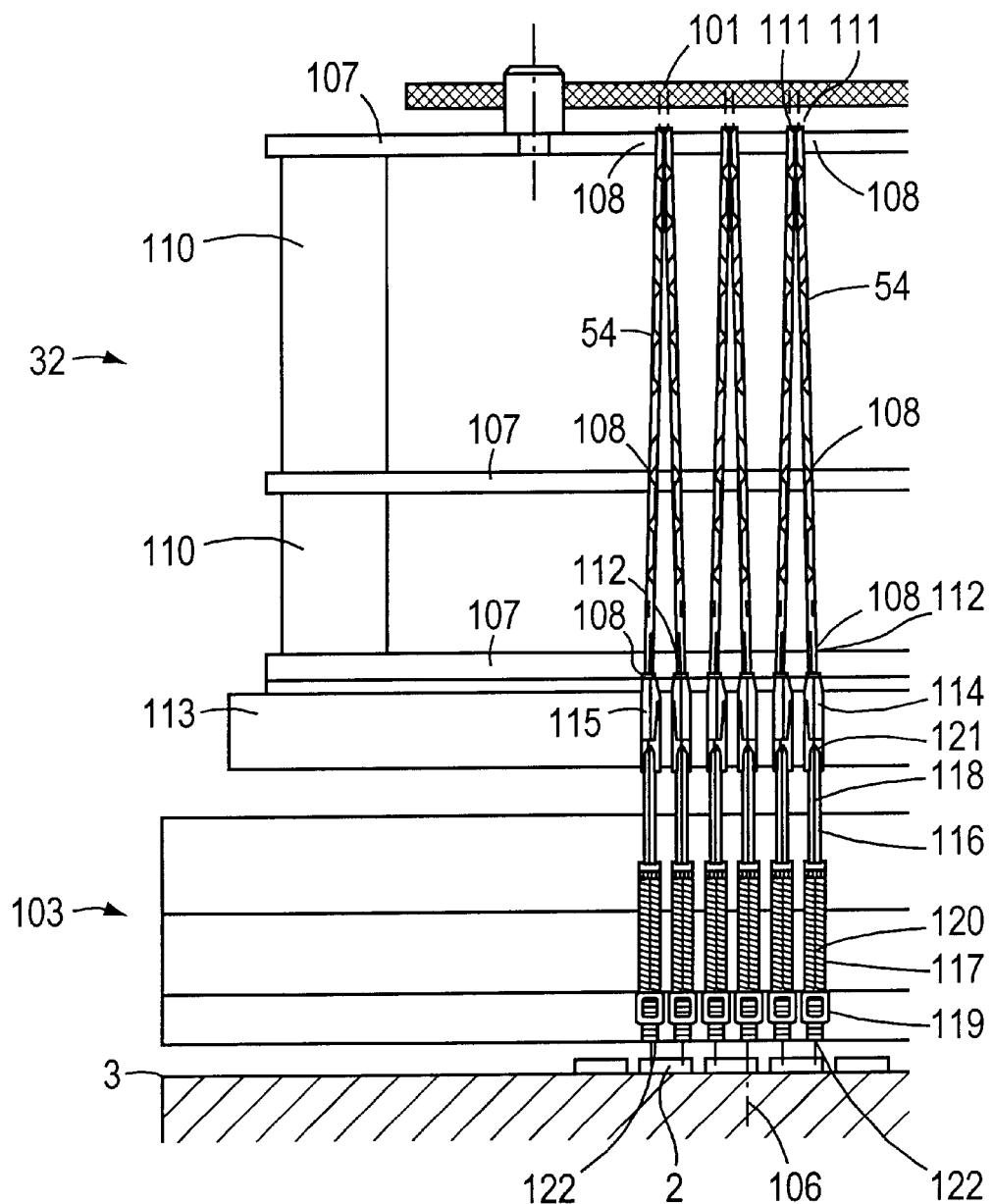
FIG. 8 is a section through a portion of a further test apparatus.

A further apparatus in accordance with the invention for testing circuit boards 101 will now be described with reference to FIG. 8. This test apparatus comprises an adapter 32 arranged between a board under test 101 and a full grid cassette 103. The full grid cassette 103 is located on a grid base 3 of the test apparatus which may be configured conventionally with a plurality of contact points or pads 2 in a regular arrangement. The pads 2 preferably have rectangular gold tabs, each pad 2 being connected via a conductor path 106 to a test connection of an electronic analyzer known as such (not shown). The conductor paths 106 may be configured alternatively also as scanning channels.

The adapter 32 comprises, e.g. three guide boards 107 in a horizontal arrangement in which feed-though holes 108 are incorporated. Probes 54 pass through the feed-though holes 108 in a more-or-less vertical arrangement. The probes 54 serve as test contacts. These test contacts may be configured as spring contacts or conducting rubber buttons or the like. Conducting rubber buttons serving as test contacts are known, for example, from EP 0 369 112 B1.

Provided on the adapter 32 are lateral vertical sidewalls 110 which maintain the guide boards 107 at a predetermined spacing and laterally close off the space defined by the guide boards 107.

The probes 54 are simple rigid probes which protrude from the topmost guide board 107 by an outer end 111 to contact a circuit board test point in each case on the circuit board 101.

Each of the lower ends 112 of the probes 54 is located in a drilled hole 108 of the lowermost guide board 107. The adapter 32 comprises, below the lowermost guide board 107, a base 113, in which vertical feed-though contacts 114 are incorporated. The feed-though contacts 114 are arranged aligned with the drilled holes 108 of the lowermost guide board 107. A cylindrical bush 115 is located shiftably in each feed-though contact 114 and locked in place in the drilled hole 114 to prevent it from dropping out.

The full grid cassette 103 comprises several layers with vertical drilled holes 116. In each hole 116, a full grid pin 117 is located. Each full grid pin 117 consists of an upper and lower pin section 118, 119, these sections being elastically and electrically conductively connected to each other in each case via a coil spring 120. The spring 120 has a larger diameter than that of the pin sections 118, 119, and the drilled holes 116 in each case are configured stepped so that the full grid pins 117 are retained captive in the full grid cassette. The free end of the upper pin section 118 is configured as a tip 121 and the free end of the lower pin section 119 comprises an obtuse contact pad 122.

The full grid pins 117 are in contact with the contact points 2 by the obtuse contact pads 122, they thereby being forced upwards against the bushes 115 and thus urging the probes 54 elastically with a pressure upwards against the test points of the circuit board 101. The contact points 2 are arranged in a regular pattern and thus form the grid pattern array. Relative to this regular grid pattern of the grid pattern array the probes 54 are deflected so that they translate the regular grid pattern of the grid pattern array into the irregular configuration of the circuit board test points.

One salient difference to conventional test apparatus is that two or more full grid pins 117 or probes 54 are assigned to the contact points 2. This assignment can and is varied as a rule, i.e., that a few contact points 2 are componented in each case with none or only one probe 54 and a few contact points 2 with two or more probes 54. The particular component arrangement of contact points 2 with probes 54 depends on the type of electrical board under test.

Due to the contact points 2 being componented multiply by probes 54, the number of useful test points is increased.

The methods as described above for avoiding undesirable electrical connections can be put to use simultaneously.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. A test apparatus for testing printed circuit boards, including an electronic analyzer comprising a plurality of test connections, wherein circuit board test points of a non-componented circuit board under test are in contact with the test connections of the electronic analyzer via electrical connections and at least two of said electrical connections are electrically connected to each other so that at least two circuit board test points of said board under test are in connection with a single test connection of said electronic analyzer wherein said test connections of said electronic analyzer are electrically connected to a grid pattern whereon an adapter and/or translator is mounted, on which a circuit board to be tested is adapted to be placed, said adapter and/or translator producing an electrical contact from the circuit board test points on said circuit board to contact points of said grid pattern, and at least two contact points of said grid pattern being connected to each other electrically.

2. The test apparatus as set forth in claim 1, wherein said grid pattern comprises two test contacts emanating from at least one contact point, each test contact being contactable with a circuit board test point of said board under test.

3. The test apparatus as set forth in claim 1, wherein said grid pattern is configured on the surface of a grid base, at least two contact points of said grid pattern being electrically connected to each other in said grid base.

4. The test apparatus as set forth in claim 3, wherein said grid base is configured as a laminated circuit board.

5. The test apparatus as set forth in claim 4, wherein feed-through contacts extend from said contact points vertically downwards through the individual layers of said grid base, said feed-through contacts and contact points being arranged in a regular grid pattern.

6. The test apparatus as set forth in claim 5, wherein said contact points have a center-spacing (a) of 100 $\mu$m to 1 mm.

7. The test apparatus as set forth in claim 6, wherein said feed-through contacts and said contact points are arranged in several rows and scanning channels are oriented between said rows of feed-through contacts, each of said feed-through contacts being electrically connected to a single scanning channel.

8. The test apparatus as set forth in claim 7, wherein each $x^{th}$ contact point of a row of contact points is electrically connected to the same scanning channel, where x is a whole number between 3 and 100.

9. The test apparatus as set forth in claim 8, wherein said translator comprises conductor paths electrically connecting said circuit board test points to said contact points, said conductor paths being configured so that no scanning channel is multiply connected to a circuit board test point.

10. The test apparatus as set forth in claim 9, wherein for electrically connecting said electrical connections between said test connections and said circuit board test points a linking mask is provided, said linking mask being arranged between an adapter and a grid pattern, said linking mask comprising conductor paths electrically connecting at least two connecting elements to a contact point of said grid pattern.

11. The test apparatus as set forth in claim 10, wherein said linking mask comprises holes through which a portion of said probes of said adapter extend to make contact with said contact points of said grid pattern.

12. The test apparatus as set forth in claim 11, wherein probes resting on said linking mask are shorter probes, lengths of which are less than longer probes extending through said holes, and during a first test procedure only said longer probes are in contact with said circuit board test points, and during a second test procedure all probes are in contact with said circuit board test points.

13. The test apparatus as set forth in claim 12, wherein a translator board is provided, the translator board having a surface, the translator board comprising contact pads on the surface, each assigned to a circuit board test point, and the translator board comprising on opposite surface contact pads, each assigned to a test connection, two of said contact pads assigned to circuit board test points being electrically connected together with a contact pad assigned to a test connection.

14. The test apparatus as set forth in claim 5, wherein said contact points have a center-spacing (a) of 300 $\mu$m to 800 $\mu$m.

15. The test apparatus as set forth in claim 7, wherein each $x^{th}$ contact point of a row of contact points is electrically connected to the same scanning channel, where x is a whole number between 10 and 30.

16. The test apparatus as set forth in claim 8, wherein said translator comprises conductor paths electrically connecting said circuit board test points to said contact points, said conductor paths being configured so that no circuit of said board under test is multiply connected to a scanning channel.

17. The test apparatus as set forth in claim 8, wherein an electrical interface is arranged on the side of said grid base for contacting said electronic analyzer.

18. The test apparatus as set forth in claim 17, wherein said electrical interface is configured as a connector.

19. The test apparatus as set forth in claim 9, wherein for electrically connecting said electrical connections between said test connections and said circuit board test points a linking mask is provided, said linking mask being arranged between an adapter and a grid pattern, said linking mask comprising conductor paths electrically connecting at least two probes of said adapter to a contact point of said grid pattern.

20. The test apparatus as set forth in claim 11, wherein probes resting on said linking mask are shorter probes, lengths of which are less than longer probes extending through said holes, and during a first test procedure only said longer probes are in contact with said circuit board test points, and during a second test procedure all probes are in contact with said circuit board test points.

21. The test apparatus as set forth in claim 1, wherein said contact points have a center-spacing (a) of 100 $\mu$m to 1 mm.

22. The test apparatus as set forth in claim 21, wherein said feed-through contacts and said contact points are arranged in several rows and scanning channels are oriented between said rows of feed-through contacts, each of said feed-through contacts being electrically connected to a single scanning channel.

23. The test apparatus as set forth in claim 22, wherein said translator comprises conductor paths electrically connecting said circuit board test points to said contact points, said conductor paths being configured so that no scanning channel is multiply connected to a circuit board test point.

24. The test apparatus as set forth in claim 22, wherein said translator comprises conductor paths electrically connecting said circuit board test points to said contact points, said conductor paths being configured so that no circuit of said board under test is multiply connected to a scanning channel.

25. The test apparatus as set forth in claim 22, wherein each $x^{th}$ contact point of a row of contact points is electrically connected to the same scanning channel, where x is a whole number between 3 and 100.

26. The test apparatus as set forth in claim 25, wherein said adapter comprises probes, each of which ends in a contact point, at least one probe being arranged tilted relative to a line standing perpendicular to said grid pattern.

27. The test apparatus as set forth in claim 22, wherein each $x^{th}$ contact point of a row of contact points is electrically connected to the same scanning channel, where x is a whole number between 10 and 30.

28. The test apparatus as set forth in claim 1, wherein said adapter comprises probes, each of which ends in a contact point, at least one probe being arranged tilted relative to a line standing perpendicular to said grid pattern.

29. The test apparatus as set forth in claim 1, wherein said contact points have a center-spacing (a) 300 $\mu$m to 800 $\mu$m.

30. A test apparatus for testing printed circuit boards, including an electronic analyzer comprising a plurality of test connections, wherein circuit board test points of a non-componented circuit board under test are in contact with the test connections of the electronic analyzer via electrical connections and at least two of said electrical connections are electrically connected to each other so that at least two circuit board test points of said board under test are in connection with a single test connection of said electronic analyzer, wherein said test apparatus comprises a grid pattern of several contact points, two test contacts emanating from at least one contact point, each test contact being contactable with a circuit board test point of said board under test and wherein an adapter is provided arranged on a full grid cassette, said full grid cassette being mounted on said grid pattern of said test apparatus, said test apparatus comprising pads as contact points in a regular arrangement, each pad being connected to an electronic analyzer via a conductor path.

31. The test apparatus as set forth in claim 1, further comprising rigid probe needles.

32. A test apparatus for testing printed circuit boards, including an electronic analyzer comprising a plurality of test connections, wherein circuit board test points of a non-componented circuit board under test are in contact with the test connections of the electronic analyzer via electrical connections and at least two of said electrical connections are electrically connected to each other so that at least two circuit board test points of said board under test are in connection with a single test connection of said electronic analyzer wherein only circuit board test points of circuits of said board under test are electrically connected when they satisfy an adjacency criterion.

33. The test apparatus as set forth in claim 32, wherein two specific circuits of said board under test satisfy an adjacency criterion when a further circuit is arranged between said two circuits.

34. The test apparatus as set forth in claim 33, wherein two specific circuits of said board under test satisfy an adjacency criterion when at no point between said two circuits the spacing is less than a predetermined adjacency spacing.

35. The test apparatus as set forth in claim 32, wherein two specific circuits of said board under test satisfy an adjacency criterion when said two circuits are arranged in differing layers of said board under test.

36. The test apparatus as set forth in claim 32, wherein two specific circuits of said board under test satisfy an adjacency criterion when at no point between said two circuits the spacing is less than a predetermined adjacency spacing.

37. The test apparatus as set forth in claim 36, wherein two specific circuits of said board under test satisfy an adjacency criterion when said two circuits are arranged in differing layers of said board under test.

38. A test apparatus for testing printed circuit boards, including an electronic analyzer comprising a plurality of test connections, wherein circuit board test points of a non-componented circuit board under test are in contact with the test connections of the electronic analyzer via electrical connections and at least two of said electrical connections are electrically connected to each other so that at least two circuit board test points of said board under test are in connection with a single test connection of said electronic analyzer wherein for electrically connecting said electrical connections between said test connections and said circuit board test points a linking mask is provided, said linking mask being arranged between an adapter and a grid pattern, said linking mask comprising conductor paths electrically connecting at least two connecting elements to a contact point of said grid pattern.

39. The test apparatus as set forth in claim 38, wherein said linking mask comprises holes through which a portion of said probes of said adapter extend to make contact with said contact points of said grid pattern.

40. A test apparatus for testing printed circuit boards, including an electronic analyzer comprising a plurality of test connections, wherein circuit board test points of a non-componented circuit board under test are in contact with the test connections of the electronic analyzer via electrical connections and at least two of said electrical connections are electrically connected to each other so that at least two circuit board test points of said board under test are in connection with a single test connection of said electronic analyzer wherein a translator board is provided, the translator board having a surface, the translator board comprising contact pads on the surface, each assigned to a circuit board test point, and comprising on the opposite surface contact pads, each assigned to a test connection, two of said contact pads assigned to circuit board test points being electrically connected together with a contact pad assigned to a test connection.

41. A method for testing circuit boards with a test apparatus comprising an adapter, the method comprising:
    determining whether two circuits of a non-componented board under test can form practically no short-circuit by reference to at least one adjacency criterion; and
    performing no short-circuit test between the two circuits if the at least one adjacency criterion is satisfied.

42. The method as set forth in claim 41, wherein at least two circuits satisfying an adjacency criterion are electrically connected and are tested in common for a short circuit relative to at least one further circuit of a further array of circuits linked to each other.

43. The method as set forth in claim 42, wherein for electrically connecting two circuits a linking mask is used, arranged between an adapter and a grid pattern, said linking mask comprising conductor paths electrically connecting at least two connecting elements.

44. The method as set forth in claim 42, wherein for electrically connecting two circuits a linking mask is used, arranged between an adapter and a grid pattern, said linking mask comprising conductor paths electrically connecting at least two of the probes of said adapter.

45. The method as set forth in claim 41, wherein at least two circuits are electrically connected to each other in series and tested in common for an open circuit and/or short-circuit, a current being supplied merely to the ends of a series connection to establish whether one of said circuits connected in series has an open circuit.

46. The method as set forth in claim 45, wherein for electrically connecting two circuits a linking mask is used, arranged between an adapter and a grid pattern, said linking mask comprising conductor paths electrically connecting at least two connecting elements.

47. The method as set forth in claim 41, wherein for electrically connecting two circuits a linking mask is used, arranged between an adapter and a grid pattern, said linking mask comprising conductor paths electrically connecting at least two connecting elements.

* * * * *